United States Patent
Hoshita et al.

(10) Patent No.: US 6,185,141 B1
(45) Date of Patent: Feb. 6, 2001

(54) SEMICONDUCTOR DEVICE ALLOWING EFFICIENT EVALUATION OF FAST OPERATION

(75) Inventors: Tetsushi Hoshita; Yuto Ikeda, both of Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/572,503

(22) Filed: May 18, 2000

(30) Foreign Application Priority Data

Dec. 3, 1999 (JP) ................................... 11-345074

(51) Int. Cl.[7] .................................................. G11C 7/00
(52) U.S. Cl. ........................ 365/203; 365/194; 365/201
(58) Field of Search .................................. 365/203, 201, 365/194

(56) References Cited

U.S. PATENT DOCUMENTS

| | | | |
|---|---|---|---|
| 5,625,597 | * 4/1997 | Gurise | 365/201 |
| 6,052,322 | * 4/2000 | Beigel et al. | 365/201 |
| 6,061,285 | * 5/2000 | Tsukikawa | 365/203 |
| 6,081,465 | * 6/2000 | Wang et al. | 365/203 |

FOREIGN PATENT DOCUMENTS 7-29375   1/1995   (JP).

* cited by examiner

Primary Examiner—Son T. Dinh
(74) Attorney, Agent, or Firm—McDermott, Will & Emery

(57) ABSTRACT

A precharge control circuit controls on/off of transfer gates to set a signal level of a precharge control signal in accordance with a level of a control signal input to a precharge command input pad when a write recovery test signal is active. In a normal operation, the precharge control circuit deactivates the write recovery test signal to set the signal level of the precharge control signal in accordance with a combination of control signals. Consequently, the precharge operation can be started in accordance with an arbitrary control signal generated by an external memory tester or the like in a test mode, and thereby evaluation of a write recovery time can be executed.

12 Claims, 12 Drawing Sheets

SEMICONDUCTOR DEVICE ALLOWING EFFICIENT EVALUATION OF FAST OPERATION

BACKGROUND OF THE INVENTION

1. Field of the Invention

The present invention relates to a semiconductor device, and particularly a semiconductor device which allows efficient evaluation of fast operation.

2. Description of the Background Art

In recent years, it has been increasingly demanded to increase operation speeds of semiconductor devices. For satisfying such demand, more severe timing accuracy have been required in a so-called memory tester, which is a checking device for executing operation check in a check step.

Particularly, some semiconductor memory circuits of a clock synchronous type require an external clock frequency of 100 MHz or more (cycle time of 10 ns or less) so that such a problem is now arising that a conventional memory tester cannot sufficiently perform the operation check. A memory tester, which can operate fast and will also be referred to as a "fast tester", is more expensive than a conventional tester which will be referred to as a "slow tester". Therefore, it is now one of important matters to suppress rise in test cost which may be caused by increase in operation speed of the semiconductor device.

A problem of the prior art will be described below taking as an example an evaluation test of a minimum write recovery time in a Synchronous Dynamic Random Access Memory (SDRAM).

A write recovery time tWR is defined as a period from input of a write command to instruction of a precharge operation. The normal write operation must be ensured when the write command is issued or the precharge operation is instructed so that tWR is equal to or longer than the minimum write recovery time.

Accordingly, the check step is performed in such a manner that the memory tester externally applies to the SDRAM signals for enabling production of the write command within the SDRAM and execution the precharge operation, and commands are internally produced in accordance with these signals to check whether the normal write operation can be executed or not. For evaluating the minimum write recovery time in the fast operation, therefore, the memory tester must apply the test signal which can continuously cause the above operations for a very short period.

FIG. 10 is a circuit diagram showing a structure of a precharge control circuit 500 in the prior art.

Referring to FIG. 10, precharge control circuit 500 controls activation (H-level) and inactivation (L-level) of a precharge control signal Prec for executing precharging.

In the normal operation, a combination of the signal levels of externally applied control signals determines whether the precharge operation is to be performed or not. In an operation of measuring a minimum write recovery time, precharge signal Prec can be activated in accordance with the signal level of a test signal TWRTST.

Referring to FIG. 10, precharge control circuit 500 includes a logic gate 510 receiving a control signal CS, which is an inverted signal of a chip select signal /CS, a control signal RAS which is an inverted signal of a row address strobe signal /RAS, and a control signal WE which is an inverted signal of a write enable signal /WE, and issuing a result of an NAND operation among these signals, an inverter 515 inverting the output of logic gate 510, and a logic circuit 520 issuing a result of an OR operation between the output of inverter 515 and test signal TWRTST.

Precharge control circuit 500 further includes an inverter 525 inverting control signal WE, a logic gate 530 which issues a result of an AND operation between test signal TWRTST and the output of inverter 525, and a logic circuit 540 issuing a result of an AND operation between the outputs of logic circuit 520 and logic gate 530. Logic circuit 540 issues precharge control signal Prec.

In the synchronous semiconductor memory device, various commands are produced in accordance with combinations of the signal levels of various control signals at the activation edge of an external clock signal.

In the normal operation, test signal TWRTST is inactive and at L-level. Therefore, precharge signal Prec is activated (H-level) when control signal /CS is at L-level (CS is at H-level), signal /RAS is at L-level (signal RAS is at H-level), signal /CAS is at H-level and signal /WE is at L-level (WE is at H-level).

FIG. 11 is a timing chart showing a method of measuring a write recovery time in a normal operation mode of precharge control circuit 500.

Referring to FIG. 11, an activate command is produced to activate a word line WL at time t0 prior to production of a write command.

After production of the activate command, a write command is produced at the activation edge of the external clock signal at time t1 (/CS=L-level, /RAS=H-level, /CAS=L-level and /WE=L-level). In response to this, an internal write control signal int.WRT is activated to attain at H-level in the SDRAM at time t2.

At time t3, i.e., at the next activation edge of the external clock signal, a precharge command is produced (/CS and /RAS=L-level, /CAS =H-level, and /WE=L-level). In response to this, precharge control signal Prec is activated, and word line WL is inactivated at time t4. In the above operation, data writing in the SDRAM is allowed for a period from time t2 to time t4.

A write recovery time to be ensured according to specifications is defined by a period tWR between production of the write command and production of the precharge command. In the check operation, therefore, it is necessary to check whether the actual write operation is executed correctly or not, by varying write recovery time tWR by the memory tester.

In the normal operation mode, and therefore when test signal TWRTST is inactive (L-level), precharge control signal Prec can be controlled only by the combination of the signal levels of various control signals at the time of activation of external clock signal EXT.CLK. Therefore, the executable fastest test depends on the operation frequency of the memory tester. Therefore, if the test requiring severe timing control were to be executed in the above situation, a fast memory tester would be required, resulting in rise in cost.

In the test mode (which may also be referred simply to as a "test mode" hereinafter) for measuring the minimum write recovery time, i.e., in the case where test signal TWRTST is active (H-level), the output of logic circuit 520 in the circuit shown in FIG. 10 is always at H-level so that precharge control signal Prec can be set by the signal level of control signal WE.

FIG. 12 is a timing chart showing a method of evaluating the write recovery time in the test mode by the precharge control circuit in the prior art.

Referring to FIG. 12, the activate command is issued to activate word line WL at time t0, similarly to the case in FIG. 11.

At time t1, i.e., at the rising edge of external clock signal EXT.CLK, the signal levels of various control signals are set to produce the write command. The signal level of write enable signal /WE is kept at L-level for a period from a time earlier by a predetermined setup time tIS than time t1 to a time (time t3) later by a predetermined hold time tIH than time t1. In accordance with this, internal write control signal int.WRT is activated (H-level) within the SDRAM at time t2.

Together with the production of this write command, test signal is activated (not shown), whereby precharge control circuit 500 activates precharge control signal Prec to attain H-level in accordance with the change of write enable signal /WE to H-level at time t3. In response to this, word line WL is inactivated at time t4. In the above operation, the data writing within the SDRAM is actually allowed for a period from time t2 to time t4.

In this case, therefore, the precharge operation can be automatically executed in accordance with change in signal level of write enable signal /WE to the H-level after instruction by the write command. Therefore, the precharge operation can be executed subsequently to the write command in accordance with timing shorter than the period of external clock signal EXT.CLK. As a result, the test of the minimum write recovery time can be executed with timing accuracy which is more severe than that of the frequency corresponding to the maximum operation frequency of the memory tester.

In the above test mode, however, write recovery time tWR cannot be set to a value equal to or lower than predetermined hold time tIH of write enable signal /WE. Accordingly, if the write recovery time must be evaluated in accordance with the timing which is more severe than this hold time, the evaluation is impossible.

Further, it is difficult to apply the test mode shown in FIG. 12 to the memory tester, which can simultaneously execute multiple measurements in parallel, such as a testing burn-in device which will also be referred to as a "TBI device", hereinafter.

Referring to FIG. 13, the drive signal for test which is issued by the TBI device has such a feature that the rise/fall time (which will also be referred to as a "tr/tf time" hereinafter) is large. This is because a device (e.g., the TBI device) simultaneously executing multiple tests in parallel requires a power supply and a driver pin of large supply capacities, and therefore the tr/tf time must be large for suppressing generation of possible overshoot or undershoot with respect to generated signals.

In FIG. 13, the signal levels of the respective control signals change in accordance with the same timing as those shown in FIG. 12.

At time t0, the activate command is produced to activate word line WL. Then, the write command is produced at time t1. In response to this, internal write control signal int.WRT is activated at time t2.

At time t3, the TBI device operates to change write enable signal /WE toward H-level. However, the rising time of write enable signal /WE is large. Therefore, precharge control signal Prec is activated at time t4 when a time Δtb elapses from time t3.

In response to activation of precharge control signal Prec, word line WL is inactivated at time t5 so that the substantial write enable period expires in accordance with the same timing. The above TBI device may be configured to activate the precharge control signal in accordance with the restoring timing of write enable signal /WE. Even in this case, however, the writing within the SDRAM is actually allowed for a relatively long period from time t2 to time t5 due to an influence of the large tr/tf time.

In the TBI device and others, therefore, it is difficult to evaluate precisely the write recovery time in the test mode.

SUMMARY OF THE INVENTION

An object of the invention is to provide a structure of a semiconductor device, which allows execution of evaluation with a severe timing accuracy even with a relatively slow tester.

In summary, the invention provides a semiconductor device for operating in response to a plurality of control signals, including a plurality of pads, a precharge control pad, a memory cell array and a control circuit.

The plurality of pad groups are provided for receiving a plurality of control signals. The precharge control pad is provided for receiving a test precharge signal for designating precharge timing in a test mode. The memory cell array includes a plurality of memory cells arranged in rows and columns, and a plurality of bit line pairs provided corresponding to the respective columns of the memory cells. The control circuit controls an operation of the semiconductor device in response to the plurality of control signals. The control circuit includes a precharge control circuit for instructing a precharge operation for the plurality of bit line pairs. The precharge control circuit instructs execution of the precharge operation in accordance with a combination of the signal levels of the plurality of control signals in a normal operation, and instructs execution of the precharge operation in accordance with the signal levels of the test precharge signal in the test mode.

According to another aspect of the invention, a semiconductor device for operating in response to a plurality of control signals, includes a memory cell array and a control circuit.

The memory cell array includes a plurality of memory cells arranged in rows and columns, and a plurality of bit line pairs arranged corresponding to the respective columns of the memory cells. The control circuit controls an operation of the semiconductor device in response to the plurality of control signals. The control circuit includes a write control circuit for activating an internal write control signal instructing a write operation for the memory cell array, and a precharge control circuit for instructing a precharge operation for the plurality of bit line pairs. The precharge control circuit instructs execution of the precharge operation in accordance with a combination of the signal levels of the plurality of control signals in a normal operation, and instructs execution of the precharge operation after elapsing of a predetermined time from activation of the internal write control signal in a test mode.

Accordingly, a major advantage of the invention is as follows. In the test mode, the execution timing of the precharge operation can be controlled by inputs via the pads without affecting the normal operation. Therefore, the allowed minimum product specifications on the fast operation such as a write recovery time can be evaluated even with a test signal produced by a slow tester, and therefore the evaluation cost can be reduced.

Further, in the test mode, the precharge operation can be executed after elapsing of a predetermined time from activation of the internal write control signal without affecting the normal operation. Consequently, the allowed minimum product specifications on the fast operation such as a write recovery time can be evaluated even by a tester which produces a test signal of a large rise/fall time, and therefore an evaluation cost can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described in greater detail with reference to the drawings. In the figures, the same or corresponding portions bear the same reference numbers.

First Embodiment

Figure 1:
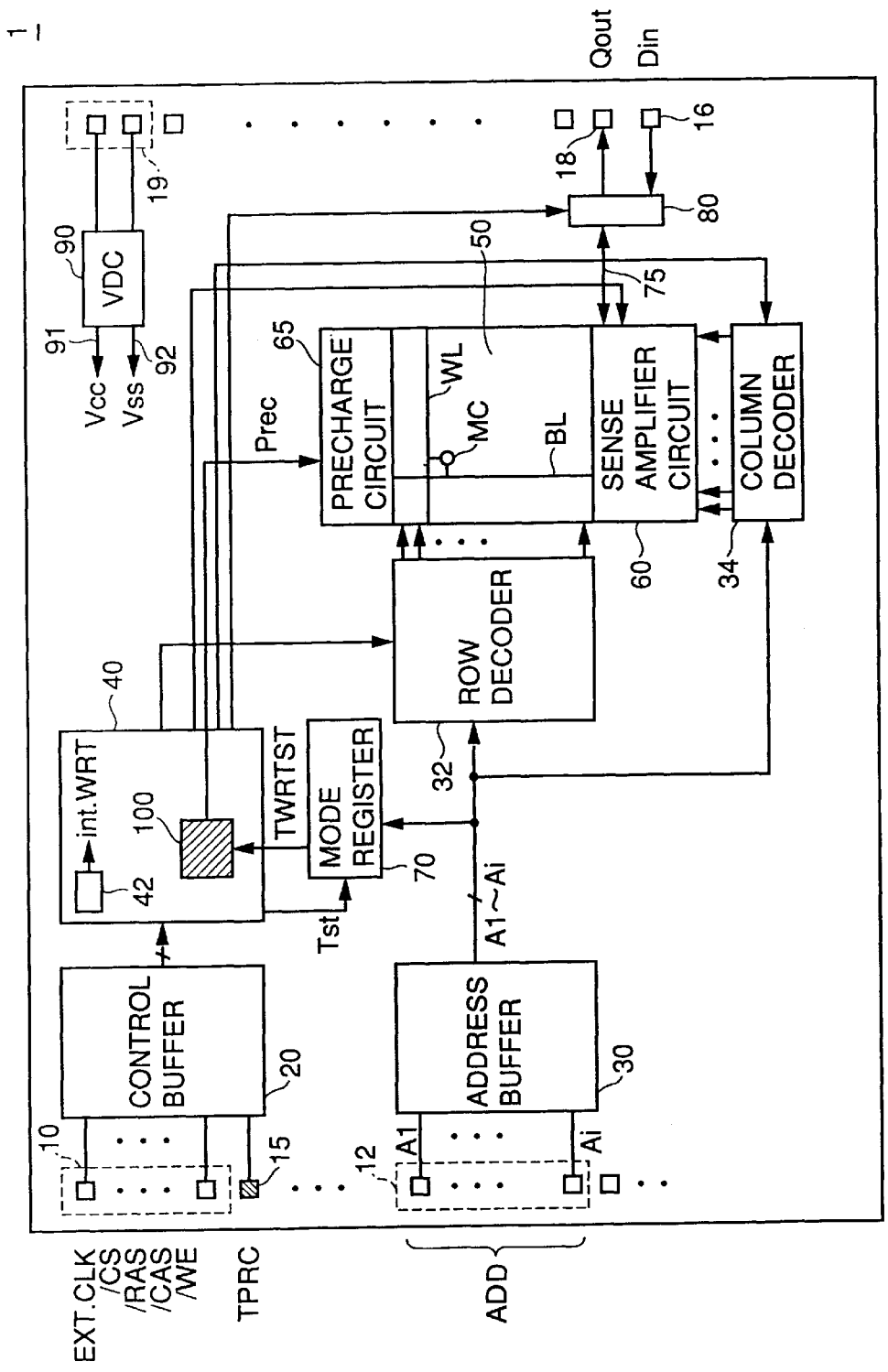
FIG. 1 is a schematic block diagram showing a whole structure of a semiconductor memory device according to a first embodiment of the invention.

Referring to FIG. 1, an Synchronous Semiconductor Memory Device (SDRAM) which is responsive to an external clock signal will now be described as a typical example of a semiconductor device according to the invention.

As will be apparent from the following description, the invention can be applied not only to the synchronous semiconductor memory device, but also to a semiconductor device which operates in response to externally supplied control signals.

Referring to FIG. 1, synchronous semiconductor memory device 1 includes pad groups which are arranged on outer peripheries of chips formed in a wafer. These pad groups can be supplied with arbitrary signal waveforms from a memory tester in a wafer test.

The pad group includes a control signal input pad group 10, which receives control signals such as an external clock signal EXT.CLK, a chip select signal /CS, a row address strobe signal /RAS, a column address strobe signal /CAS and a write enable signal /WE, and also includes a precharge command input pad 15 receiving a test precharge signal TPRC, an address input pad group 12 receiving respective bits A1–Ai (i: natural number) of an address signal ADD, a data input pad 16 receiving write data, a data output pad 18 sending read data therefrom, and a power supply pad 19 receiving a power supply voltage.

Semiconductor memory device 1 further includes a memory cell array 50 having a plurality of memory cells arranged in rows and columns. A word line is provided for each row of the memory cells, and a bit line pair is provided for each column of the memory cells. FIG. 1 shows, as a typical example, a word line WL and one of paired bit line BL provided for one memory cell MC.

Semiconductor memory device 1 further includes a sense amplifier circuit 60 which senses and amplifies a voltage difference appearing on each bit line pair, and a precharge circuit 65 which sets each bit line pair to a predetermined voltage level under the control of precharge control signal Prec.

Semiconductor memory device 1 further includes an address buffer 30 receiving bits A1–Ai of the address signal, a row decoder 32 for selecting the row of memory cells in response to the address bits issued from address buffer 30, and a column decoder 34 for selecting the column of memory cells. Row decoder 32 selectively activates the word lines in response to the address bits. The bit line pair corresponding to the column selected by column decoder 34 is connected to a sense amplifier circuit 60.

Semiconductor memory device 1 further includes a control buffer 20 which receives the clock signal and the control signals sent from control signal input pad group 10 as well as test precharge signal TPRC sent from precharge command input pad 15, and transmits them to a control circuit 40, and control circuit 40 which receives the foregoing clock signal, control signal and others, and controls the whole operation of semiconductor memory device 1.

Control circuit 40 includes a write control circuit 42 for activating an internal write control signal int.WRT when the write command is issued in accordance with the combination of the signal levels of the control signals, and a precharge control circuit 100 which controls execution of the precharge operation. Precharge control circuit 100 produces precharge control signal Prec for instructing activation of precharge circuit 65. Precharge control signal Prec is activated (H-level) in the precharge operation.

Semiconductor memory device 1 further includes a mode register 70. Mode register 70 activates write recovery time test signal TWRTST in response to the combination of the signal levels of address bits A1–Ai when control circuit 100 activates a test mode signal Tst in response to the combination of the supplied control signals, and thereby the operation enters the test mode.

Write recovery time test signal TWRTST is activated (H-level) when the write recovery time is to be evaluated in the test mode. In FIG. 1, only the output of the signal required for evaluation of the write recovery time in the test mode is depicted as a typical example among functions of mode register 70.

Semiconductor memory device 1 further includes a data I/O circuit 80. Data I/O circuit 80 transmits the write data, which is supplied through data input pad 16, to memory cell array 50 via an I/O line 75, and writes it into the memory cell selected in accordance with the address signal. Also, data I/O circuit 80 receives via I/O line 75 the data, which is read from the memory cell selected in accordance with the address signal, and is amplified by sense amplifier circuit 60, and outputs it from data output pad 18.

A Voltage Down Converter (VDC) 90 receives a voltage applied to a power supply input pad 19, and generates an internal power supply voltage Vcc and a ground voltage Vss. Internal power supply voltage Vcc is supplied to various portions through a power supply interconnection 91, and ground voltage Vss is supplied to various portions through a ground interconnection 92.

Figure 2:
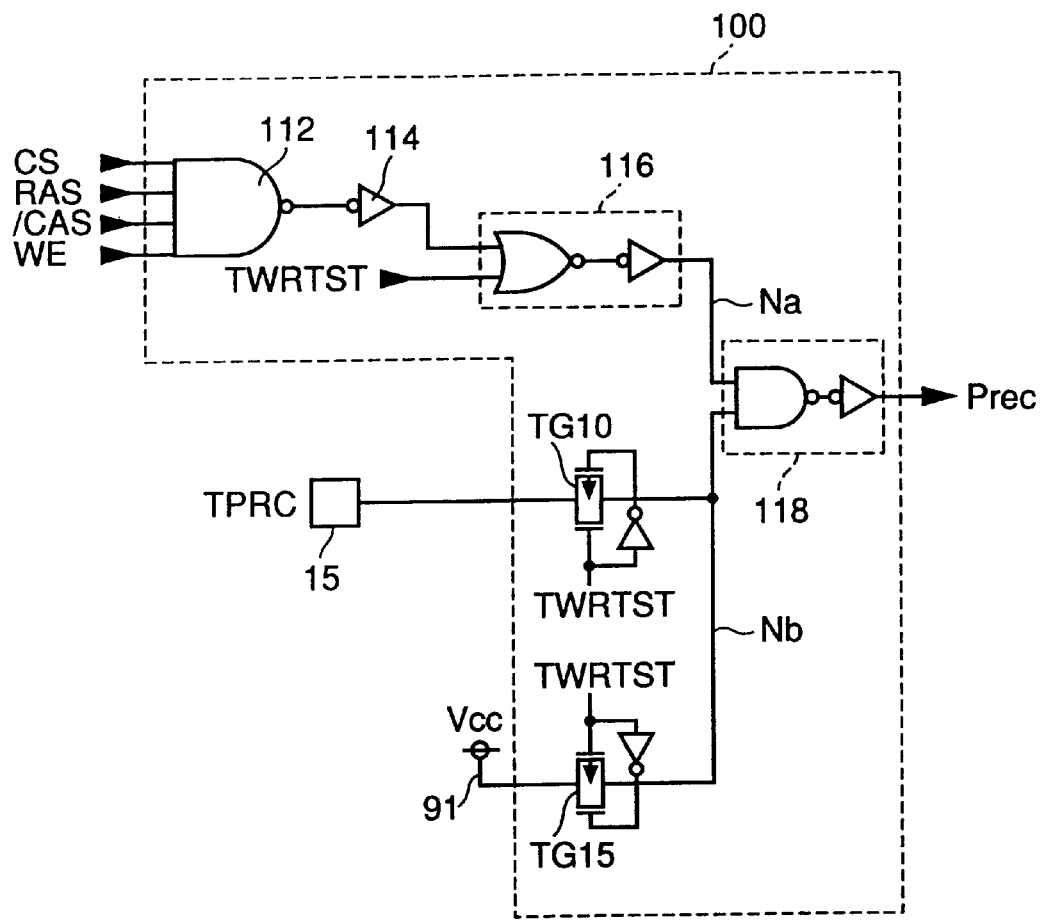
FIG. 2 is a circuit diagram showing a structure of a precharge control circuit 100.

Referring to FIG. 2, precharge control circuit 100 includes a logic gate 112 which receives control signals CS, RAS and WE, i.e., inverted signals of chip select signal /CS, row address strobe signal /RAS and write enable signal /WE as well as column address strobe signal /CAS, and issues a result of an NAND operation performed on the signal levels of the control signal thus received, and an inverter 114 which inverts the output of logic gate 112.

Precharge control circuit 100 further includes a logic circuit 116 which issues a result of an OR operation between the output of inverter 114 and write recovery time test signal TWRTST to an internal node Na, a transfer gate TG10 connected between precharge command input pad 15 and an internal node Nb, a transfer gate TG15 connected between a power supply interconnection 91 and internal node Nb, and a logic circuit 118 which issues, as precharge control signal Prec, a result of an AND operation between the voltage levels on internal nodes Na and Nb. Transfer gates TG10 and TG15 are turned on/off in response to write recovery time test signal TWRTST. In FIG. 2, control buffer 20 arranged in a stage following precharge command input pad 15 is not shown for simplicity reason.

In the normal operation, write recovery time test signal TWRTST is inactive (at L-level) so that the voltage level on internal node Na is determined in accordance with the combination of the various control signals which are supplied to logic gate 112. The voltage level on node Nb is fixed to the level of internal power supply voltage Vcc because transfer gate TG15 is on and transfer gate TG10 is off.

In the normal operation, the signal level of precharge control signal Prec is equal to the voltage level on internal node Na, and the precharge operation is executed in response to the combination of signal levels of the control signals which are supplied to logic gate 112.

When the write recovery time is to be evaluated in the test mode, the write recovery time test signal TWRTST is activated (H-level) so that the output of logic circuit 116, i.e., the voltage level on internal node Na is fixed to H-level. Also, transfer gate TG10 is turned on, and transfer gate TG15 is turned off. Accordingly, the signal level on internal node Nb becomes equal to a signal level of a test precharge signal TPRC supplied to precharge input pad 15.

Accordingly, when the write recovery time is evaluated in the test mode, it is possible to execute externally the precharge operation in accordance with arbitrary timing by the memory tester or the like.

Figure 3:
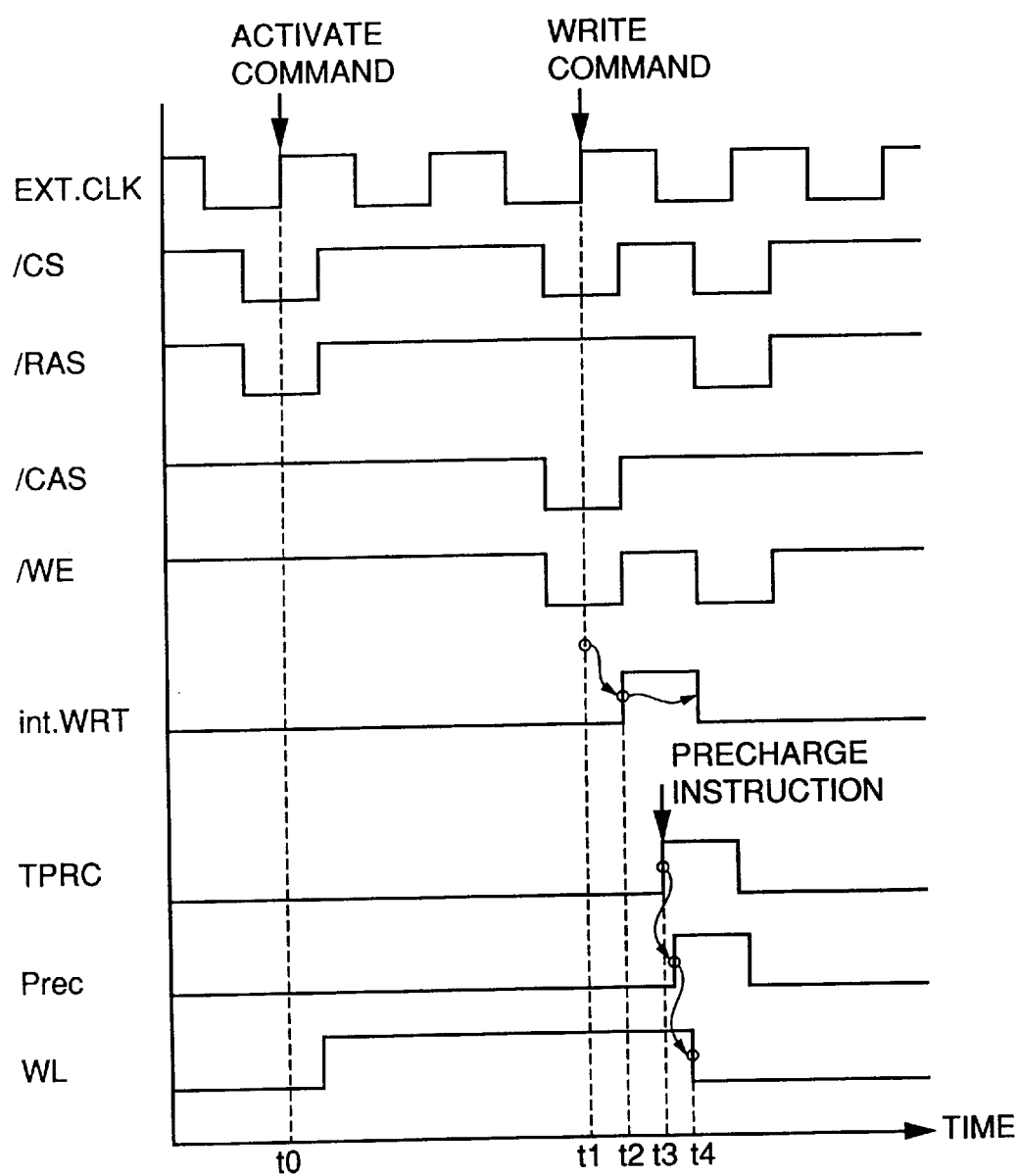
FIG. 3 is a timing chart showing a method of evaluating a write recovery time by precharge control circuit 100.

Referring to FIG. 3, description will now be given on evaluation of the write recovery time by the precharge control circuit according to the first embodiment. In FIG. 3, it is assumed that the test mode is already selected, and write recovery test mode signal TWRTST is already active (at H-level), although not shown.

At time t0, the activate command is executed, and word line WL is activated. At time t1, the write command is produced in response to the rising edge of external clock signal EXT.CLK. In response to this, write control circuit 42 activates internal write control signal int.WRT at time t2.

At time t3, test precharge signal TPRC which is externally applied by the memory tester or the like, is activated (H-level). Thereby, the precharge operation starts, and precharge control signal Prec is activated (H-level). Thereby, word line WL is inactivated at time t4.

Accordingly, the data writing can be actually performed within semiconductor memory device 1 for a period from time t2 to time t4, and it is possible to evaluate the time period from time t1 to time t3 as write recovery time tWR corresponding to the above period.

As described above, the activation timing of test precharge signal TPRC can be arbitrarily determined by the external memory tester or the like. Therefore, evaluation of the write recovery time requiring severe timing accuracy can be executed without depending on the operation frequency and others of the memory tester. As a result, the write recovery time of the semiconductor device of a high operation frequency can be evaluated even with a slow tester, and the yield of memory cells of a small write margin can be improved by calculation while suppressing a test cost.

As already described with reference to FIG. 2, when write recovery time test signal TWRTST is inactive (L-level), the precharge operation can be performed only in response to the signal levels of the externally supplied various control signals without exerting any influence on characteristics of the normal operation.

Second Embodiment

A semiconductor device according to a second embodiment is configured to allow execution of a test similar to that of the first embodiment even in a final product check step which is performed on a device enclosed in a product package.

Figure 4:
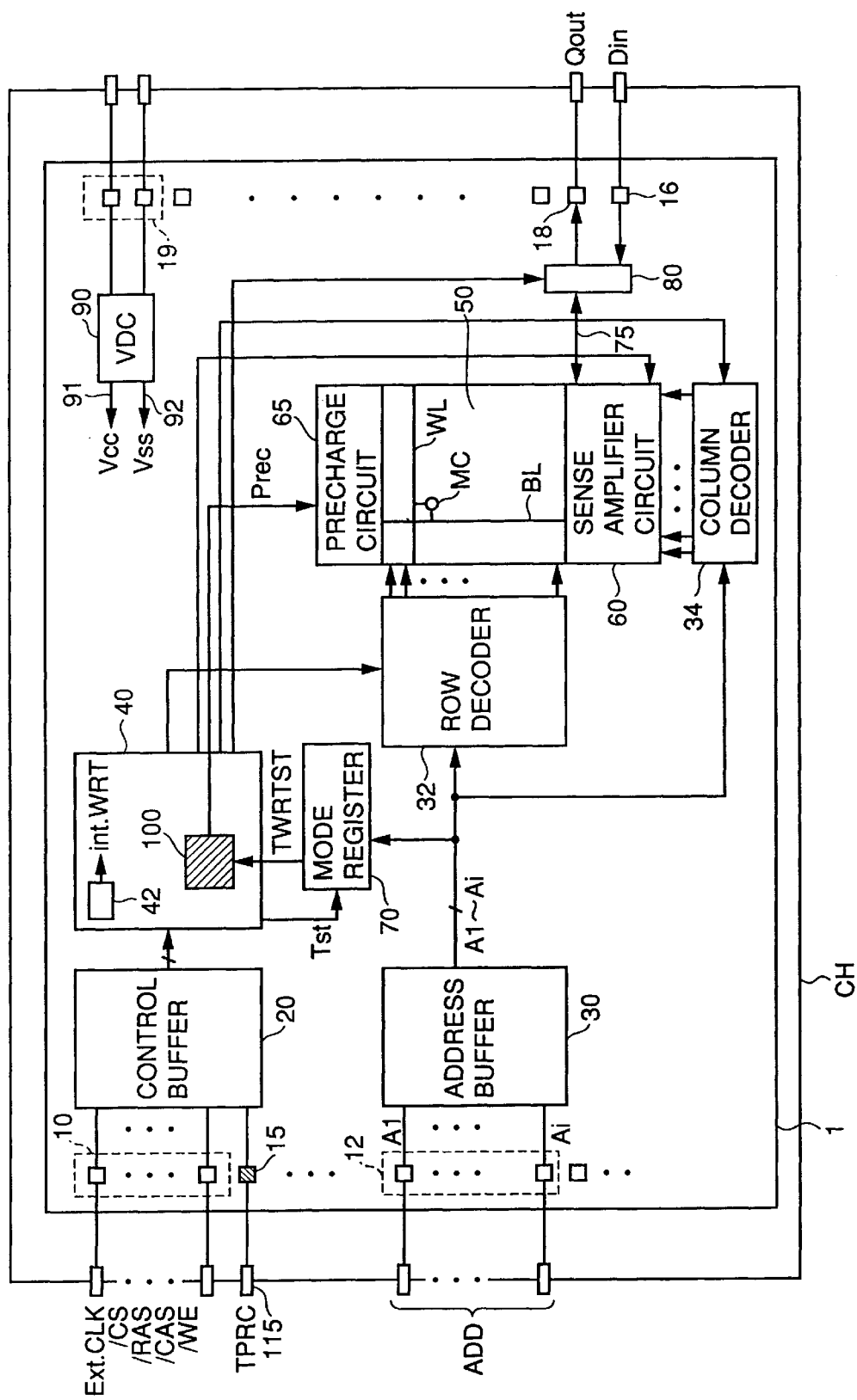
FIG. 4 is a schematic block diagram showing a structure of a semiconductor memory device according to a second embodiment.

Referring to FIG. 4, semiconductor memory device 1 already described with reference to FIG. 1 is covered with a sealed product package, and is arranged in a chip CH. Chip CH is provided at its periphery with a plurality of external terminals (pins) for external transmission of signals.

A semiconductor memory device according to the second embodiment has such a feature that precharge command input pad 15 is wire-bonded to an external terminal 115 allowing external input of signals into the product chip, and thereby test precharge signal TPRC can be externally supplied via external terminal 115.

Thereby, even when the device is already accommodated in the chip forming a final product, the precharge command can be externally activated in accordance with arbitrary timing by the external memory tester. Therefore, evaluation of the write recovery time requiring severe timing accuracy can be executed even with the slow memory tester.

The structure and operation of semiconductor memory device 1 are the same as those shown in FIG. 1, and therefore description thereof is not repeated.

In the structure shown in FIG. 4, external terminal 115 for input of test precharge signal TPRC is independent of external terminal group for input of other control signals. However, external terminal 115 can be used also for receiving another control signal.

Figure 5:
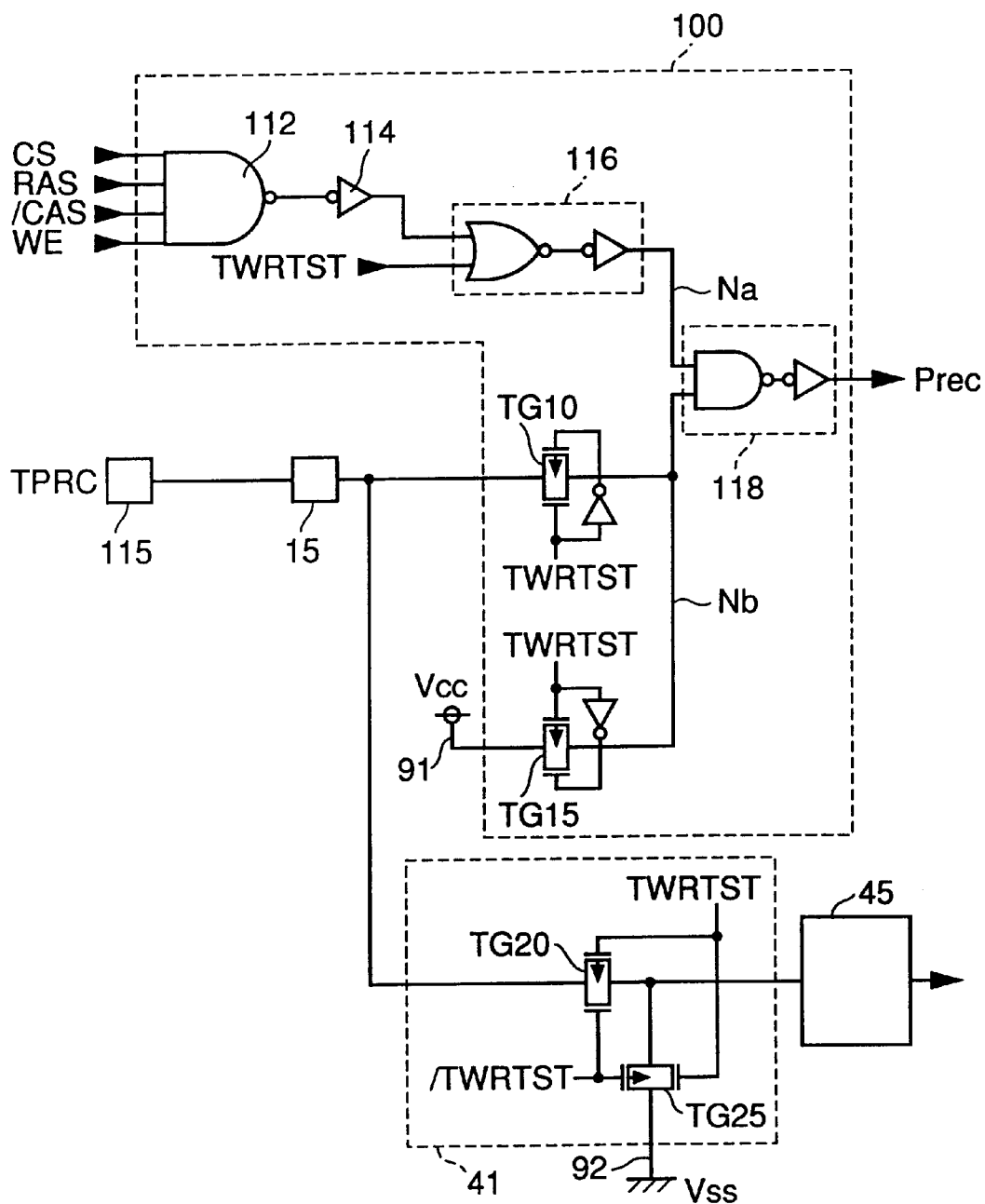
FIG. 5 is a circuit diagram showing a structure for using a precharge signal input terminal also as another control signal input terminal.

Referring to FIG. 5, precharge command input pad 15 is connected to external terminal 115, which can be externally supplied with a signal, via wire bonding or the like. Precharge control circuit 100 activates precharge control signal Prec in response to the voltage level on precharge command input pad 15 when evaluating the write recovery time, similarly to the manner already described. The structure and operation of precharge control circuit 100 are similar to those already described with reference to FIG. 2, and therefore description thereof is be repeated. Similarly to FIG. 2, control buffer 20 is not shown.

In the structure shown in FIG. 5, external terminal 115 is used also for receiving another control signal such as a control signal DQM for instructing masking of the I/O data. Data mask control signal DQM is supplied to a data mask control circuit 45, which determines execution/stop of the data mask operation in accordance with the signal level of control signal DQM transmitted to its input node.

As an example, it is now assumed that data mask control circuit 45 executes the data mask operation when control signal DQM is at H-level, and does not execute the data mask operation when control signal DQM is at L-level (Vss).

Referring to FIG. 5, a signal selector circuit 41 is arranged between precharge command input pad 15 and data mask control circuit 45. Signal selector circuit 41 includes a transfer gate TG20 arranged between precharge command input pad 15 and the input node of data mask control circuit 45, and a transfer gate TG25 which is arranged between the input node of data mask control circuit 45 and a ground interconnection 92.

Transfer gates TG20 and TG25 are turned on/off in accordance with write recovery time test signal TWRTST. More specifically, transfer gate TG20 is turned on/off in accordance with the same timing as transfer gate TG15 in precharge control circuit 100, and transfer gate TG25 is turned on/off in accordance with the same timing as transfer gate TG10 in precharge control circuit 100.

In the operation of evaluating the write recovery time, transfer gates TG10 and TG25 are on, and transfer gates TG15 and TG20 are off. As a result, internal node Nb of precharge control circuit 100 is supplied with the level of the signal supplied to external terminal 115, and the level on the input node of data mask control circuit 45 is fixed to ground voltage Vss.

In the normal operation, transfer gates TG15 and TG20 are on, and transfer gates TG10 and TG25 are off. Thereby, the voltage level on internal node Nb is fixed to internal power supply voltage Vcc, and precharge control signal Prec is controlled in response to the combination of the signal levels of various control signals supplied to logic gate 112. The internal node of data mask control circuit 45 is connected to external terminal 115, and data mask control circuit 45 can operate in accordance with control signal DQM supplied to external terminal 115.

Even in the form of the final product including the device mounted on the chip, the device can receive the externally supplied test precharge signal owing to the above structure, and the external terminal receiving the test precharge signal can also be used as an external terminal for receiving another control signal.

In the second embodiment, control signal DQM for instructing masking of the I/O data is used merely as an example of another control signal. By employing similar structures, the external terminal can be commonly used for input of the test precharge signal and another control signal.

Third Embodiment

A third embodiment described below relates to a structure, which allows evaluation of the write recovery time with severe timing accuracy even by a memory tester using a driver signal of a large rise/fall time.

The semiconductor memory device according to the third embodiment differs from the semiconductor memory device according to the first embodiment in the structure of the precharge control circuit and the fact that precharge command input pad 15 receiving test precharge signal TPRC is not required. Structures other than the above are the same as those of the first embodiment, and description thereof is not repeated. Only the whole structure is shown in the figure.

Figure 6:
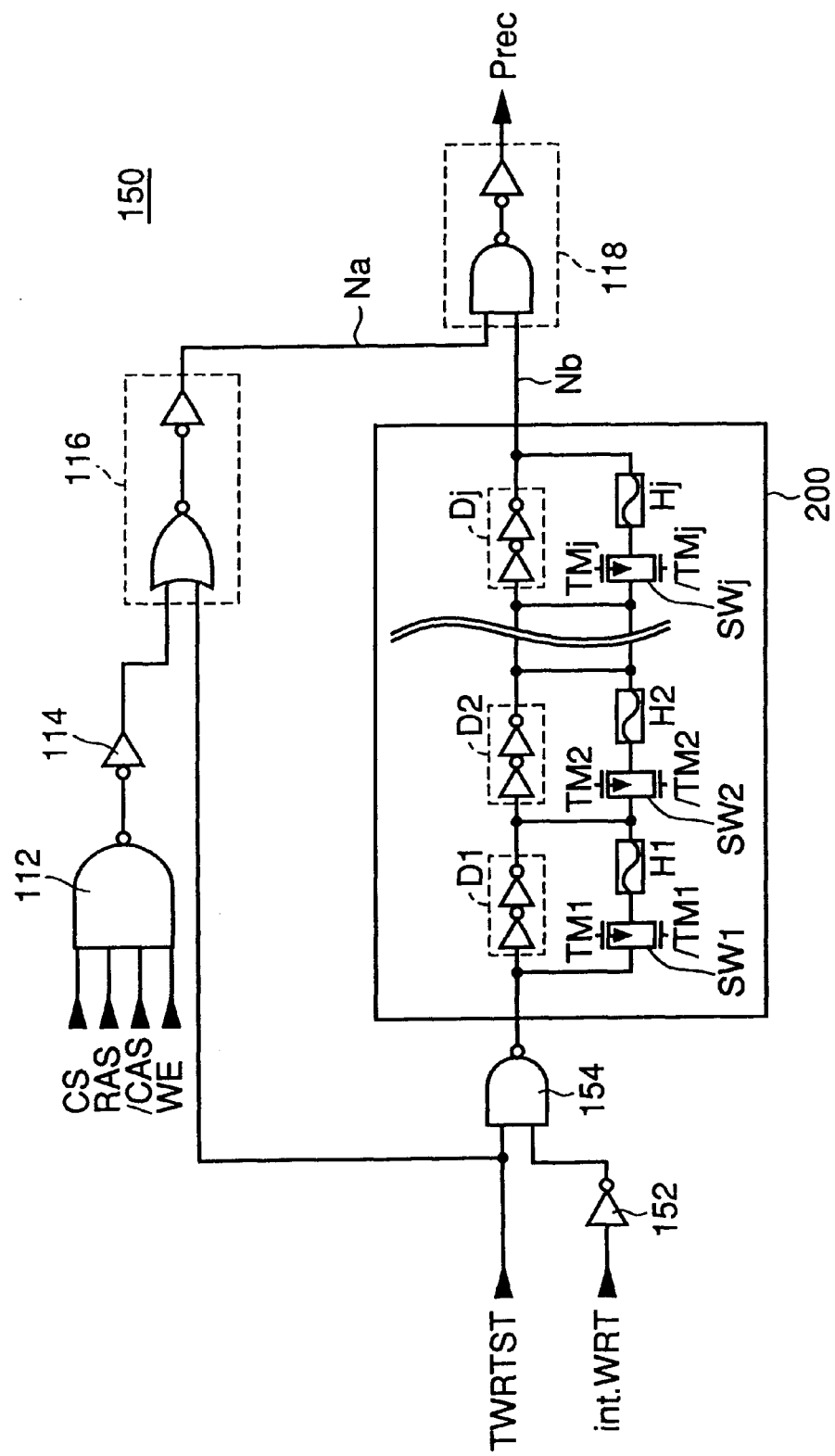
FIG. 6 is a circuit diagram showing a structure of a precharge control circuit 150 according to a third embodiment.

Referring to FIG. 6, precharge control circuit 150 according to the third embodiment differs from precharge circuit 100 shown in FIG. 2 only in that it is connected to internal node Nb.

More specifically, precharge control circuit 150 includes an inverter 152 for inverting internal write control signal int.WRT, a logic gate 154 issuing a result of an NAND operation between the output of inverter 152 and write recovery time test signal TWRTST, and a delay circuit 200 which delays the output of logic gate 154 and issues it to internal node Nb.

In precharge control circuit 150, the voltage level on internal node Na is set similarly to that in precharge control circuit 100.

Delay circuit 200 includes delay elements D1–Dj of j (j: natural number) in number which are connected in series between logic gate 154 and internal node Nb, and sets of switches and fuses arranged in parallel to the delay elements, respectively. For example, switch SW1 and fuse H1 are arranged in parallel to corresponding delay circuit D1. Likewise, the sets each including the switch and the fuse are arranged in parallel to the delay elements, respectively.

Switches SW1–SWj are controlled by independent control signals TM1–TMj as well as inverted signals /TM1–TMj thereof, respectively. Each delay element is bypassed and therefore does not add a delay time when both the corresponding switch and fuse are on. When one or both of the corresponding switch and fuse are off, the signal passes through the corresponding delay element so that a predetermined unit delay time is applied to the signal.

Fuses H1–Hj can be blown off by an externally supplied electrical input, and control signals TM1–TMj can be produced by the mode register in accordance with the combination of the signal levels of address bits A1–Aj in the test mode.

Accordingly, the delay time added by delay circuit 200 can be controlled in accordance with the signal levels of control signals TM1–TMj and on/off of the fuses.

Owing to the above structure, the signal level on internal node Nb is always set to H-level when write recovery time test signal TWRTST is inactive (L-level), and precharge control signal Prec is activated in response to the control signal supplied to logic gate 112.

During evaluation of the write recovery time, write recovery time test signal TWRTST is active (H-level). During this, the voltage level on internal node Nb is set in accordance with the signal level of internal write control signal int.WRT, and more specifically, rises to H-level after elapsing of the delay time applied by delay circuit 200 from activation of signal int.WRT.

In the operation of evaluating the write recovery time, precharge control signal Prec is activated in response to the signal level on node Nb so that precharge control circuit 150 can start the precharge operation after the adjustable delay time is applied by delay circuit 200, based on activation of internal write control signal int.WRT.

Figure 7:
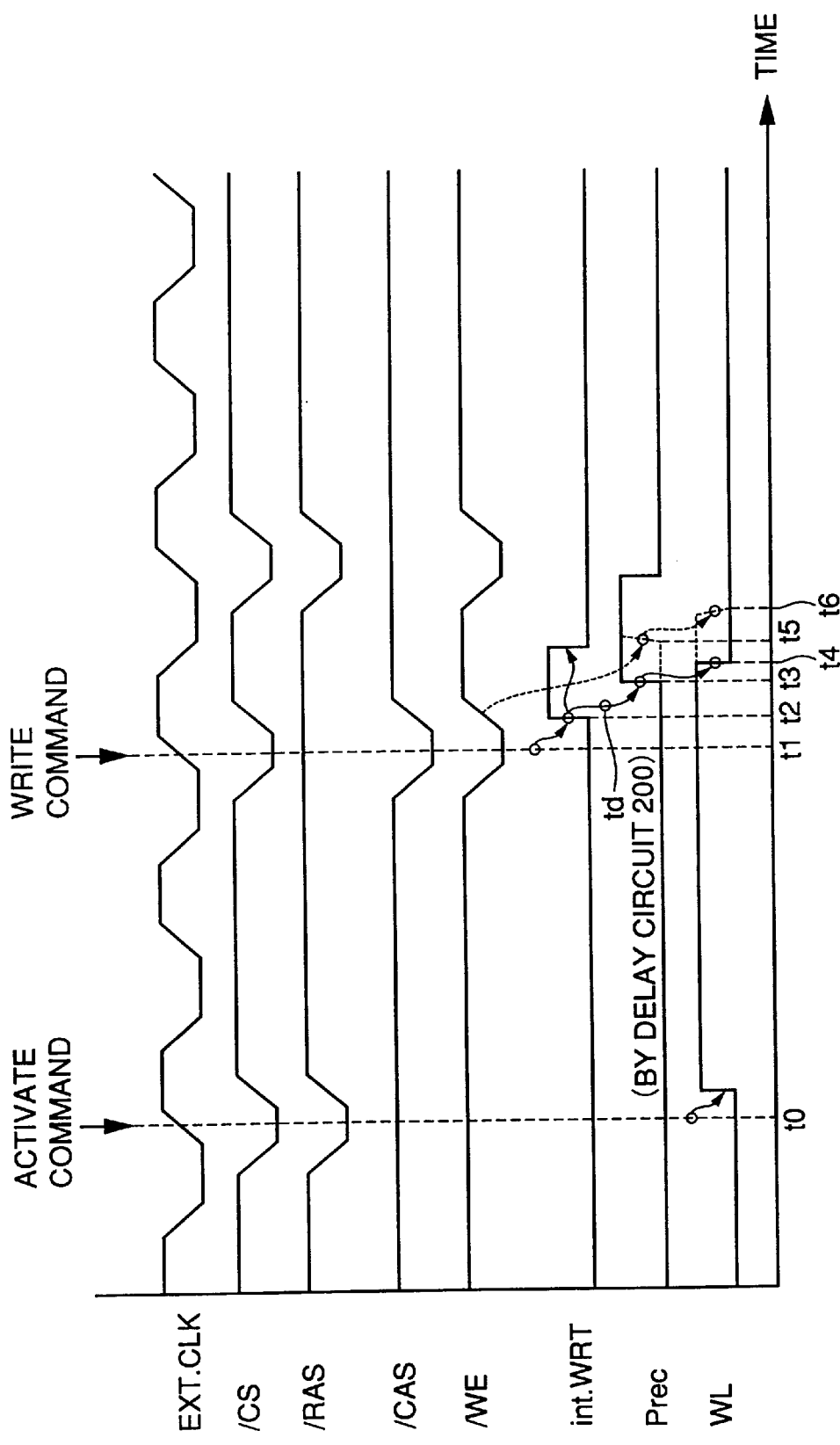
FIG. 7 is a timing chart showing measurement of a write recovery time by a precharge control signal using a memory tester with a driver signal of a large rise/fall time.

Referring to FIG. 7, the activate command is produced and word line WL is activated at time t0. Then, the write command is produced at the rising edge of external clock signal EXT.CLK at time t1, and thereby internal write control signal int.WRT is activated at time t2.

In precharge control circuit 150, precharge control signal Prec is activated in response to activation of internal write control signal int.WRT at time t3 after elapsing of the delay time td, which is determined by delay circuit 200, from the activation of write control signal int.WRT.

At time t4, word line WL is inactivated, and data write enabled period expires. Thereby, activation of the precharge control signal Prec and thus start of the precharge operation can be performed in accordance with arbitrary timing by adjusting delay time td determined by delay circuit 200.

As a result, the period during which the internal data writing of the SDRAM is actually allowed can be determined from time t2 to time t4, and thus can be short even when the memory tester uses the driver signal of large tr/tf time. As a result, the write recovery time can be evaluated with a severe timing accuracy even by such a memory tester.

In FIG. 7, dotted lines represent the case for comparison, in which precharge control signal Prec is activated in response to write recovery signal /WE as already described in the prior art. In this case, write recovery signal /WE, which is one of the driver signals of the memory tester, has a large tr/tf time. This affects and increases the actual data writable period (from time t2 to time t6), and therefore the fact that the evaluation of the write recovery time with the severe timing accuracy is difficult can be confirmed.

Fourth Embodiment

A fourth embodiment described below relates to a structure, which allows efficient adjustment of the delay time added by the delay circuit already described in connection with the third embodiment.

Figure 8:
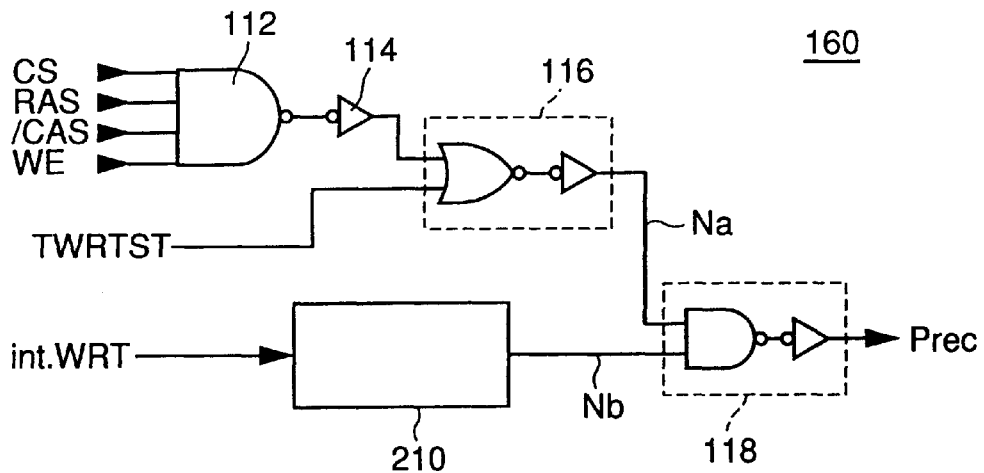
FIG. 8 is a circuit diagram showing a structure of a precharge control circuit 160 according to a fourth embodiment.

Referring to FIG. 8, a precharge control circuit 160 according to the fourth embodiment differs from precharge control circuit 150 in that a delay circuit 210 is employed as a circuit for setting the voltage level on internal node Nb, instead of logic gate 154 and delay circuit 200. Other structures and operation are the same as those of precharge control circuit 150, and therefore description thereof is not repeated.

Figure 9:
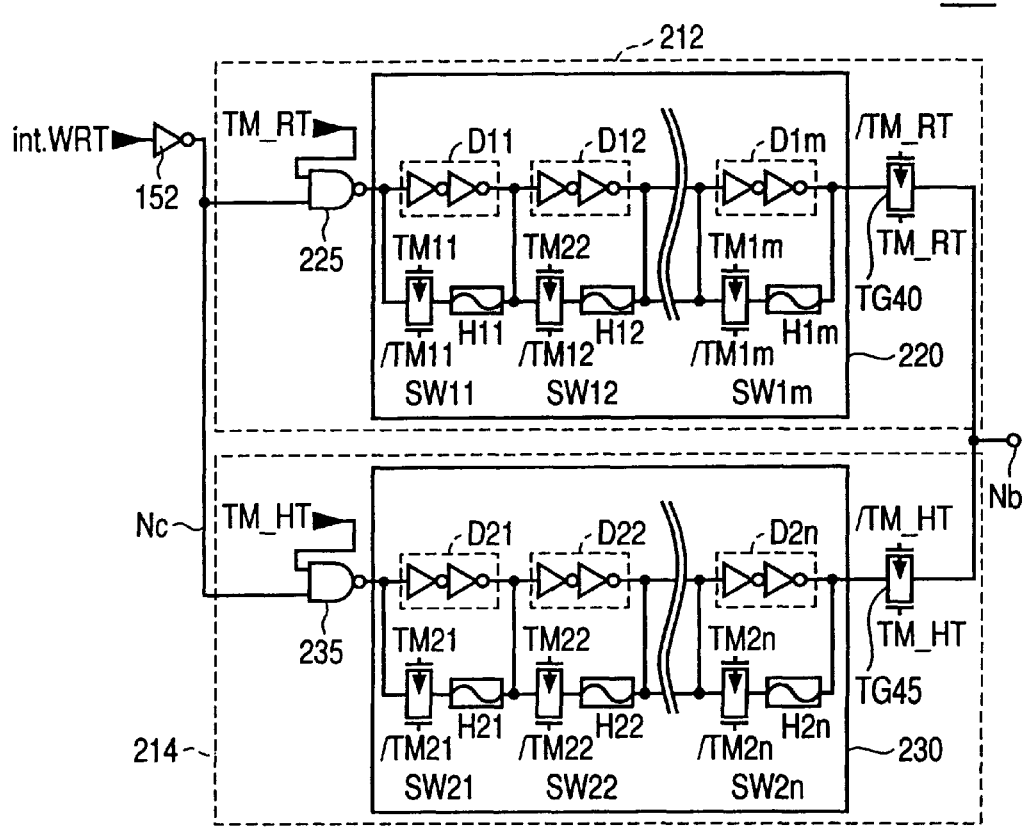
FIG. 9 is a circuit diagram showing a structure of a delay circuit 210.
Figure 10:
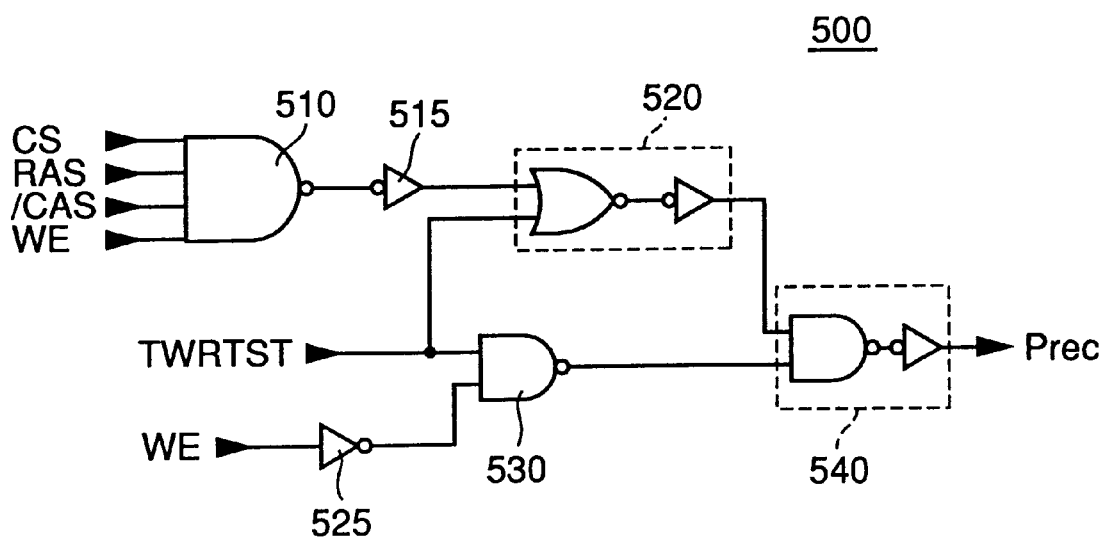
FIG. 10 is a circuit diagram showing a structure of a precharge control circuit 500 in the prior art.
Figure 11:
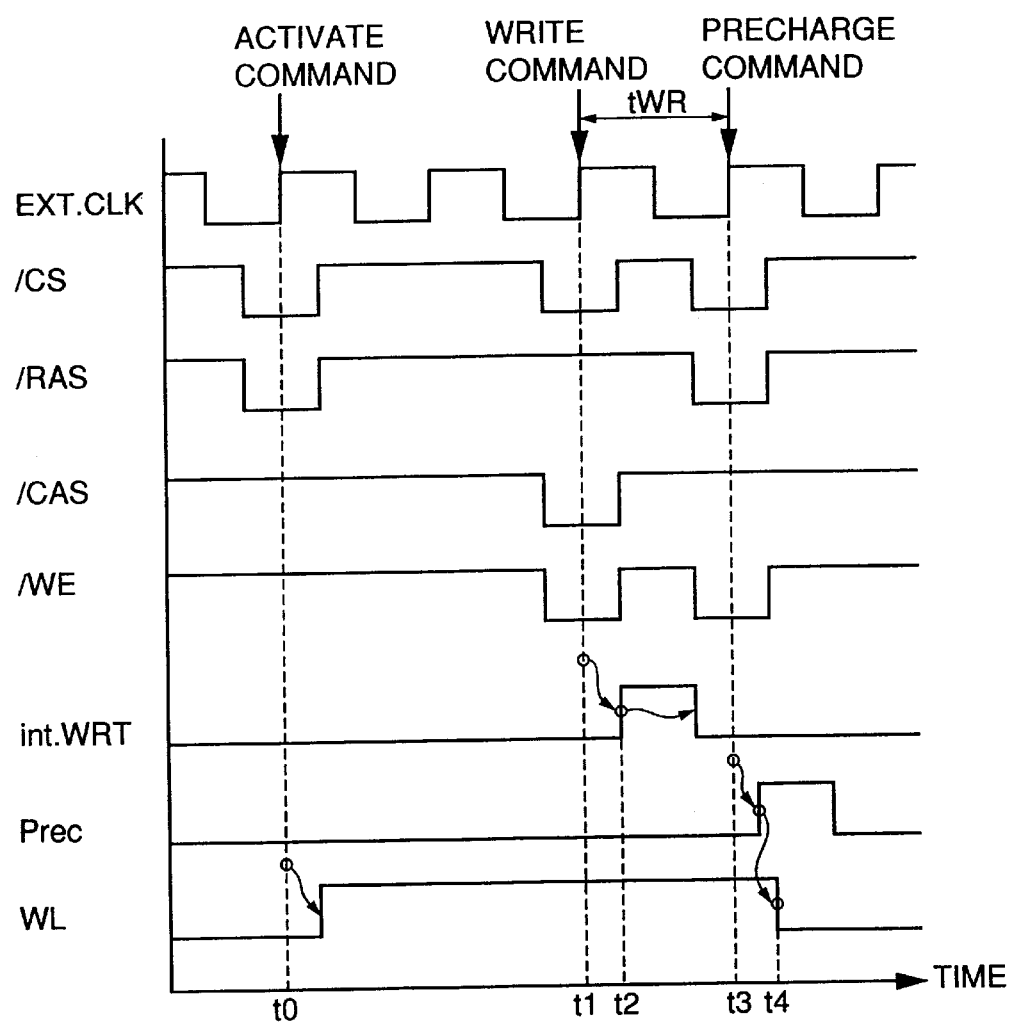
FIG. 11 is a timing chart showing measurement of the write recovery time in the normal operation mode by precharge control circuit 500.
Figure 12:
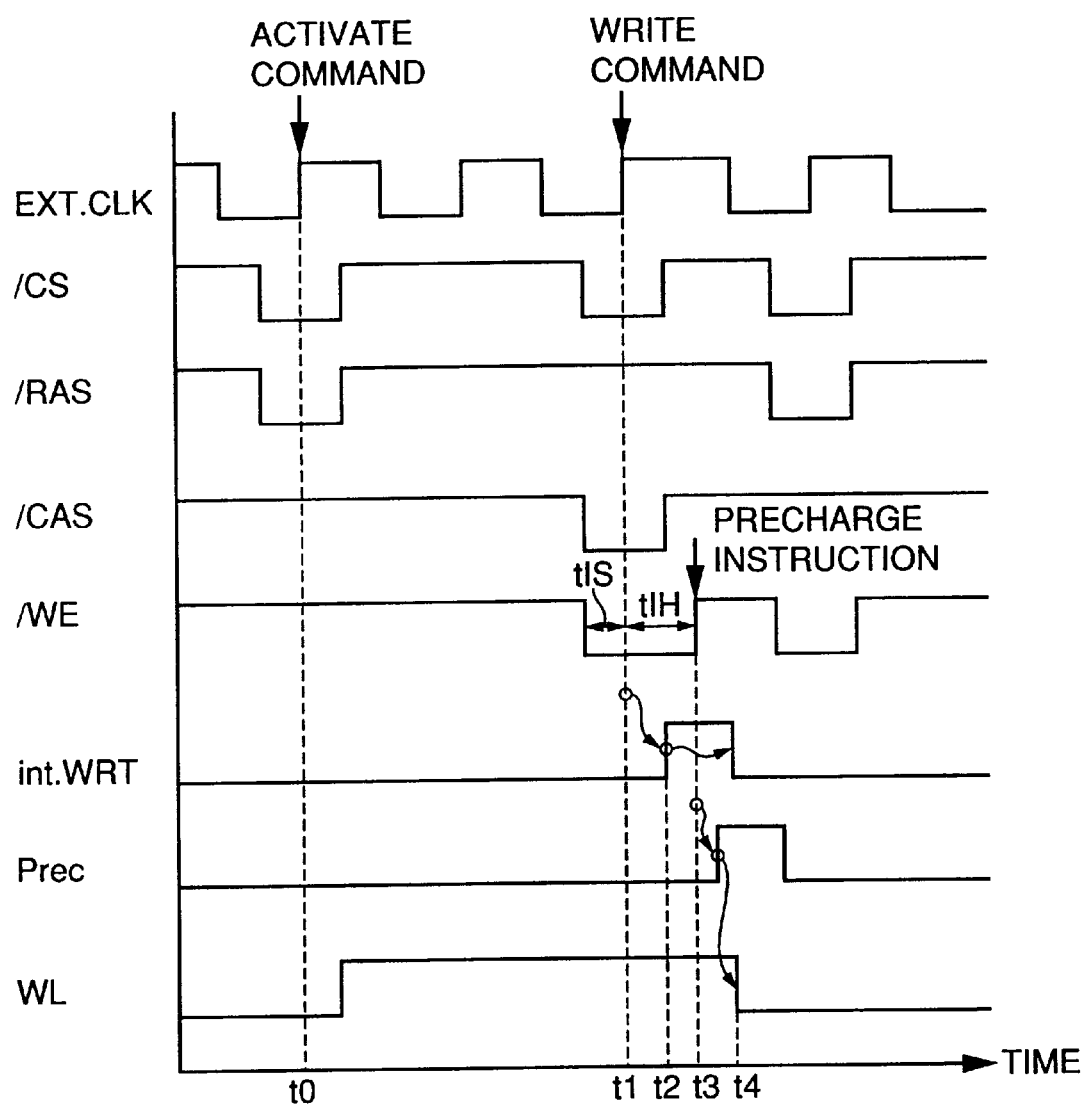
FIG. 12 is a timing chart showing evaluation of the write recovery time in the test mode by the precharge control circuit in the prior art.
Figure 13:
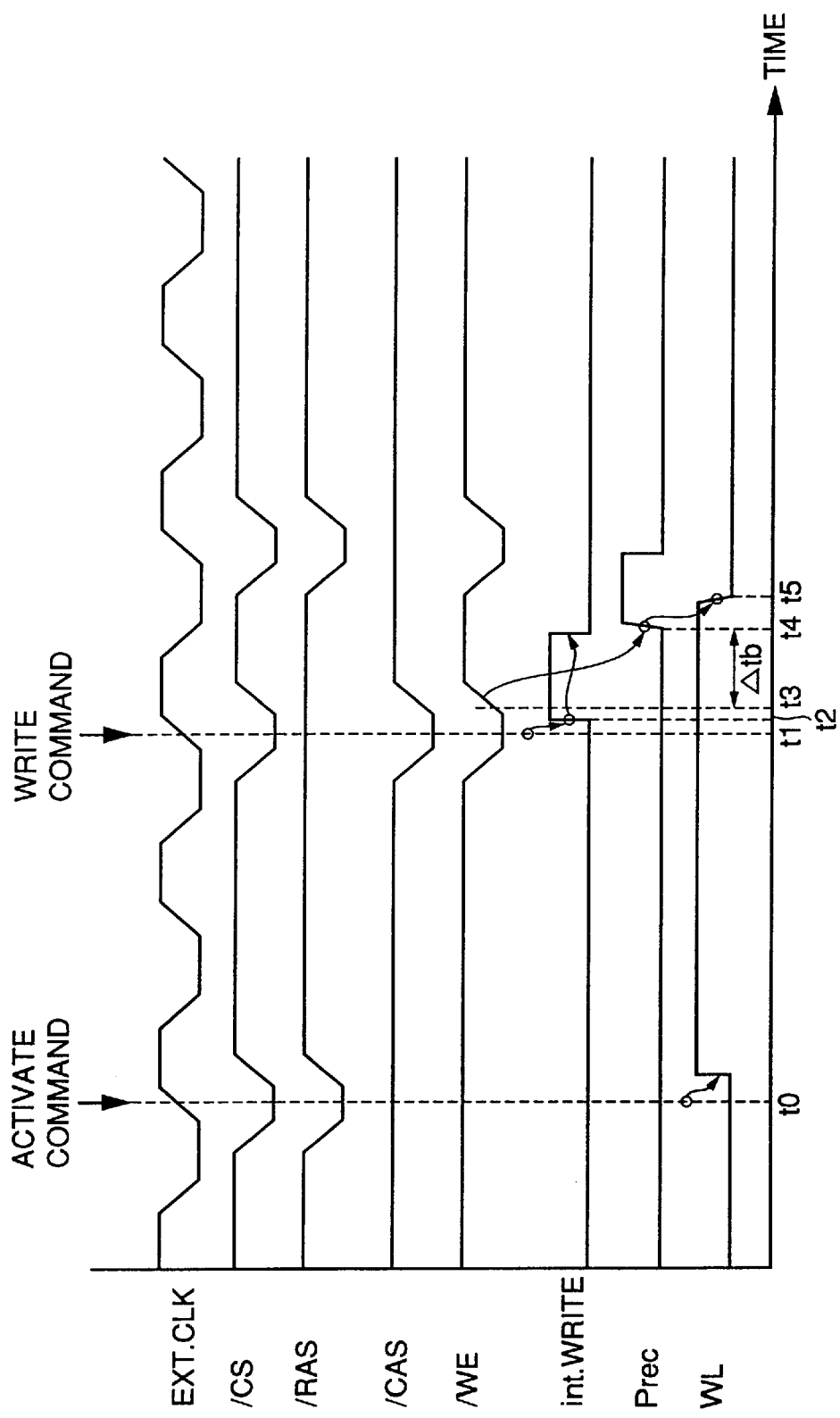
FIG. 13 is a timing chart showing a problem caused by evaluation of the write recovery time with a memory tester using a driver signal of a large rise/fall time such as a TBI device.

Referring to FIG. 9, a delay circuit 210 has sub-delay circuits 212 and 214, which are connected in parallel between inverter 152 and internal node Nb. Sub-delay circuits 212 and 214 have signal delay portions 220 and 230 which can set different delay times, respectively.

Sub-delay circuit 212 further has a logic gate 225 arranged between an internal node Nc and signal delay portion 220, and a transfer gate TG40 arranged between signal delay portion 220 and internal node Nb. Likewise, sub-delay circuit 214 further has a logic gate 235 arranged between internal node Nc and signal delay portion 230, and a transfer gate TG45 arranged between signal delay portion 230 and internal node Nb.

Logic gate 225 issues a result of an NAND operation between output inverter 152 and a control signal TM_RT to signal delay portion 220. Likewise, logic gate 235 issues a result of an NAND operation between output inverter 152 and a control signal TM_HT to signal delay portion 230. Transfer gates TG40 and TG45 are turned on/off in response to control signals TM_RT and TM_HT, respectively.

Signal delay portion 220 has delay elements D11–D1m of m (m: natural number) in number which are connected in series as well as sets which are connected in parallel with delay elements D11–D1m, and include switches SW11–SW1m and fuses H11–H1m, respectively. Likewise, signal delay portion 230 has delay elements D21–D2m of n (n: natural number) in number which are connected in series as well as sets which are connected in parallel with delay elements D21–D2m, and include switches SW21–SW2n and fuses H21–H2n, respectively.

Control signals TM_RT and TM_HT are issued by mode registers similarly to control signals TM11–TM1m and TM21–TM2m.

Signals TM_RT and TM_HT are complementarily activated on. Owing to the above structure, the delay times which are applied by the respective sub-delay circuits corresponding to different temperature regions, respectively, can be tuned in accordance with timing substantially corresponding to the actual test conditions, and thereby the delay time can be switched among significantly different values in accordance with the conditions.

As a result, the delay time can be adjusted over a wide range while achieving an advantage relating to the layout, as compared with a structure in which many delay elements are arranged merely in series. Since the set of fuse and switch is employed, and is arranged in parallel to the corresponding delay element. Therefore, final fine adjustment, which may be required due to variations in transistor parameters, can be performed by blowing off the fuse(s) so that adjustment can be easily performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device for operating in response to a plurality of control signals, comprising:
   a plurality of pads for receiving a plurality of control signals;
   a precharge control pad for receiving a test precharge signal for designating precharge timing in a test mode;
   a memory cell array including a plurality of memory cells arranged in rows and columns,
   said memory cell array including a plurality of bit line pairs arranged corresponding to the respective columns of said memory cells; and
   a control circuit for controlling operations of said semiconductor device in response to said plurality of control signals,
   said control circuit including a precharge control circuit for instructing a precharge operation for said plurality of bit line pairs, and
   said precharge control circuit instructing execution of said precharge operation in accordance with a combination of the signal levels of said plurality of control signals in a normal operation, and instructing execution of said precharge operation in accordance with the signal levels of said test precharge signal in the test mode.

2. The semiconductor memory device according to claim 1, wherein
   said precharge control pad can be externally supplied with the signal in a wafer test operation.

3. The semiconductor memory device according to claim 2, wherein
   said precharge control circuit includes:
      a first logic operation circuit issuing a result of a logic operation according to the signal levels of said plurality of control signals,
      a second logic operation circuit issuing the output signal of said first logic operation circuit to a first node in said normal operation, and fixing the signal level on said first node in said test mode,
      a first transfer gate for electrically coupling said precharge control pad to a second node in said test mode,
      a second transfer gate for electrically coupling said second node to a power supply node supplying a predetermined voltage in said normal operation, and a third logic operation circuit issuing a precharge control signal instructing execution of said precharge operation in accordance with the voltage levels on said first and second nodes.

4. The semiconductor memory device according to claim 1, further comprising
a terminal allowing reception of a signal from outside a product package, wherein
said precharge control pad is electrically coupled.

5. The semiconductor memory device according to claim 4, wherein
said precharge control circuit includes:
a first logic operation circuit issuing a result of a logic operation according to the signal levels of said plurality of control signals,
a second logic operation circuit issuing the output signal of said first logic operation circuit to a first node in said normal operation, and fixing the signal level on said first node in said test mode,
a first transfer gate for electrically coupling said precharge control pad to a second node in said test mode,
a second transfer gate for electrically coupling said second node to a power supply node supplying a predetermined voltage in said normal operation, and
a third logic operation circuit issuing a precharge control signal instructing execution of said precharge operation in accordance with the voltage levels on said first and second nodes.

6. The semiconductor memory device according to claim 4, wherein
said control circuit further includes:
a sub-control circuit for executing a predetermined operation in response to activation of an externally supplied command signal, and
an input selector circuit arranged between said precharge control pad and said sub-control circuit; and
said input selector circuit transmits the voltage level on said precharge control pad to said sub-control circuit in said normal operation, and transmits the voltage level corresponding to the inactive state of the externally supplied command signal to said sub-control circuit.

7. A semiconductor device for operating in response to a plurality of control signals, comprising:
a memory cell array having a plurality of memory cells arranged in rows and columns,
said memory cell array including a plurality of bit line pairs arranged corresponding to the respective columns of said memory cells; and
a control circuit for controlling operations of said semiconductor device in response to said plurality of control signals,
said control circuit including:
a write control circuit for activating an internal write control signal instructing a write operation for said memory cell array, and
a precharge control circuit for instructing a precharge operation for said plurality of bit line pairs, and
said precharge control circuit instructing execution of said precharge operation in accordance with a combination of the signal levels of said plurality of control signals in a normal operation, and instructing execution of said precharge operation after elapsing of a predetermined time from activation of said internal write control signal in a test mode.

8. The semiconductor memory device according to claim 7, wherein
said precharge control circuit includes:
a first logic operation circuit issuing a result of a logic operation according to the signal levels of said plurality of control signals,
a second logic operation circuit issuing the output signal of said first logic operation circuit to a first node in said normal operation, and fixing the signal level on said first node in said test mode,
a delay circuit delaying said internal write control signal by said predetermined time for issuing the delayed signal to a second node in said test mode, and
a third logic operation circuit issuing a precharge control signal instructing execution of said precharge operation in accordance with the voltage levels on said first and second nodes.

9. The semiconductor memory device according to claim 8, wherein
said delay circuit includes:
a plurality of delay units connected in series between an input node of said delay circuit and said second node, and
a plurality of short-circuit switches coupled in parallel to said plurality of delay units, respectively; and
said plurality of short-circuit switches can be turned on/off in accordance with an externally applied input in said test mode.

10. The semiconductor memory device according to claim 9, wherein
said delay circuit further includes a plurality of fuse elements connected in series to said plurality of short-circuit switches, respectively, and
each of said plurality of fuse elements can be blown off by an externally applied electrical input.

11. The semiconductor memory device according to claim 8, wherein
said delay circuit has a plurality of sub-delay circuits arranged in parallel,
said plurality of sub-delay circuits have delay times different from each other, respectively, and
said control circuit selectively renders one of said plurality of sub-delay circuits an enable state, and renders the others of said plurality of sub-delay circuits a disable state, in said test mode.

12. The semiconductor memory device according to claim 11, wherein
each of said plurality of sub-delay circuits includes:
a fourth logic operation circuit fixing a voltage level on a third node in said disabled state and setting the voltage level on said third node to the signal level of said internal write control signal in said enabled state,
a plurality of delay units connected in series between said third node and a fourth node,
a plurality of sets provided corresponding to said plurality of delay units, respectively, and each including a short-circuit switch and a fuse connected together in series, and
a transfer gate arranged between said fourth node and said second node, and being turned on in said enabled state; wherein
each of said plurality of sets is coupled in parallel to the corresponding one of said plurality of delay units,
said short-circuit switch can be turned on/off by an externally applied input in said test mode, and
said fuse can be blown off by an externally applied electric input.

* * * * *